Oct. 3, 1967

R. W. WILSON 3,345,210

METHOD OF APPLYING AN OHMIC CONTACT TO THIN FILM PASSIVATED RESISTORS

Filed Aug. 26, 1964

INVENTOR.
Richard W. Wilson

BY Mueller & Aichele

ATT'YS.

United States Patent Office 3,345,210
Patented Oct. 3, 1967

1 2

3,345,210
METHOD OF APPLYING AN OHMIC CONTACT TO THIN FILM PASSIVATED RESISTORS

Richard W. Wilson, Phoenix, Ariz., assignor to Motorola, Inc., Franklin Park, Ill., a corporation of Illinois
Filed Aug. 26, 1964, Ser. No. 392,136
4 Claims. (Cl. 117—212)

Figure 1:
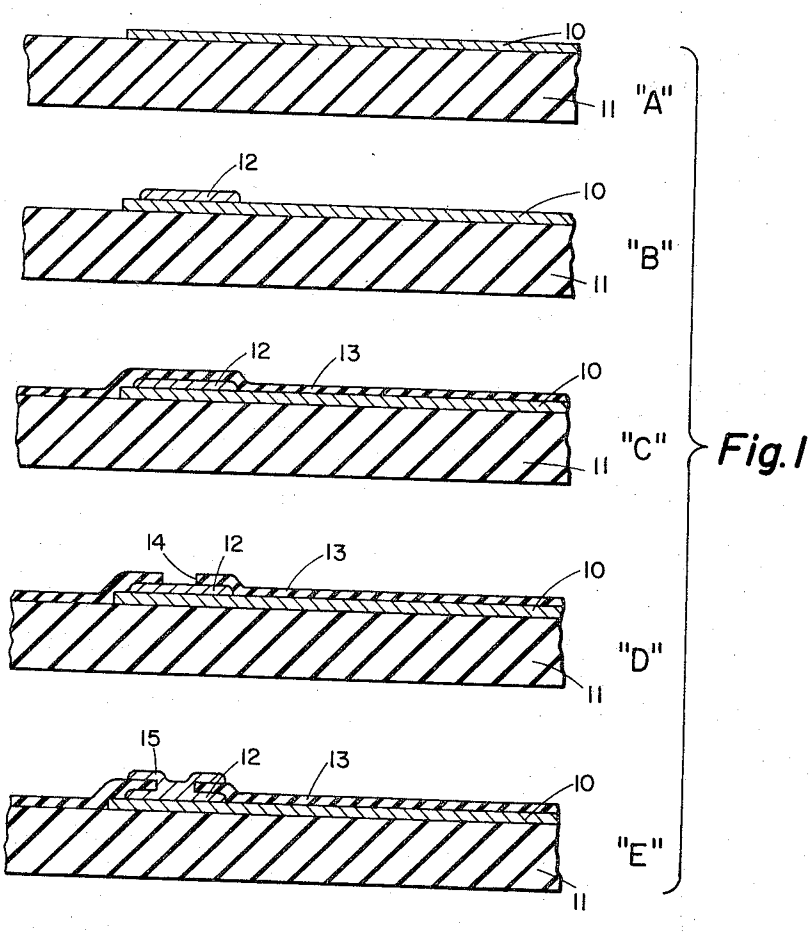

This invention relates to electrical resistors, and particularly to a method of passivating and making ohmic contacts to thin film resistors.

With the growth of microcircuit technology, new applications have been found for thin film circuit elements. Conventional thin film circuits are made by depositing thin film resistors and capacitors on a passive substrate, typically of glass or ceramic, and subsequently interconnecting complete prefabricated active components with the thin film elements. Monolithic integrated circuits have active components, and sometimes passive components too, fabricated within a semiconductor crystal element, and there is usually a passivating oxide layer on the semiconductor surface. Thin film components can be deposited on top of the passivating layer and interconnected with the active components beneath that layer. The resulting structures are known as compatible integrated circuits. Conventional thin film circuits and compatible integrated circuits are both within the broader classification of devices called integral circuit packages.

One of the conditions which must be taken into account in fabricating thin film elements for integral circuit packages is the high temperature stressing which will be encountered after the elements are completed. Semiconductor elements are often bonded to the base of their package at temperatures above 400° C. Flat packages are sometimes sealed at temperatures between 400° and 500° C. Completed packages are sometimes tested at temperatures up to 500° C. for reliability evaluation purposes. Such temperatures may cause drastic changes in unprotected thin film components. For example, the nickel of a nickel-chromium resistor oxidizes rapidly enough at these temperatures to cause a pronounced change in the value of the resistor. Resistors made from nitride compounds may react with nitrogen in the ambient at elevated temperatures producing a similar change.

These effects can be reduced by coating the resistor film with a passivating medium such as an oxide layer. The passivation layer acts to seal out ambient gases, and in high temperature aging studies such passivated components have proved to be more stable than unpassivated components. However, it has been difficult to make good ohmic contact to a passivated resistive film for integrated circuits.

If holes are etched through the passivation layer to allow metallization of the underlying film through the holes, there is a definite possibility that the film will be etched away at the exposed area. There is also a possibility that the etching will not go completely through the passivation layer and so will leave some oxide material covering the area where contact is to be made to the resistor. The contact metal which is subsequently deposited in the holes may not alloy through the residual oxide when heated to enhance adherence, and in this case good contact to the resistor is not obtained. Even if the metal penetrates the oxide enough to make an electrically satisfactory contact, it may not adhere well to the resistor.

Accordingly, it is an object of this invention to provide a method of passivating and making contact to thin film resistors which is more reliable than the methods just referred to.

Another object of the invention is to eliminate uncertainty in etching a hole through a passivating layer on a thin film resistor, and to thereby assure that the etchant will remove all of the passivation layer at an area where a contact is to be made, but will not remove the resistor itself.

A feature of the invention is a double metallization method of making contacts to passivated thin film resistors in which the contact areas are metallized before the passivating oxide is deposited, and then after holes are etched through the oxide to the first metallized areas a second metallization is done to bring the contacts up over the passivating layer. The preliminary metallization step improves the contacts because the metal is deposited on a relaitvely uncontaminated surface of the resistor. The etching can proceed until some of the metal on the resistor is removed in order to assure positive opening of holes through the passivating layer without removing the resistor material. Thus, the preliminary metallization step affords improved reliability in making contacts to passivated thin film resistors.

Figure 2:
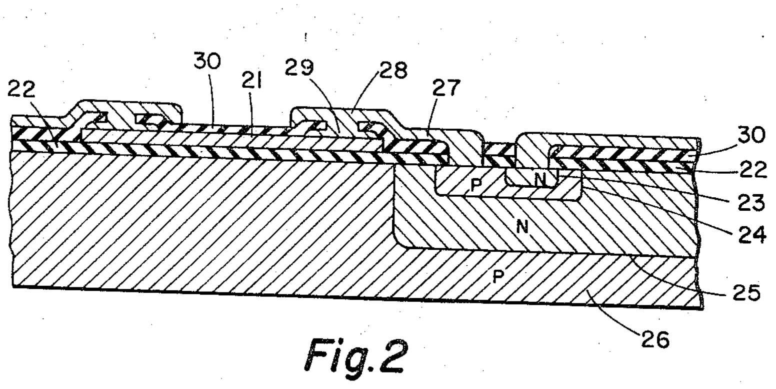

In the accompanying drawings:

FIG. 1 is a series of fragmentary sectional views, enlarged over actual size, illustrating the steps of the double metallization method of making contacts; and FIG. 2 is a fragmentary sectional view, also greatly enlarged showing a thin film resistor to which contacts have been made by the method of FIG. 1, the resistor in this case being provided on top of the oxide passivating layer of an integrated circuit.

At the present time, most resistor films for integrated circuits are made of nickel-chromium alloys known as "Nichrome," and the method of the invention will be described as it has been applied to the fabrication of nickel-chromium resistors. However, it will be apparent that the method can be applied to thin film resistors of other materials, tin oxide being a possible alternative. Examples of experimental materials for thin film resistors are tantalum carbide, boron silicide, tin nitride, molybdenum boride and chrome silicon monoxide. These materials and related materials are available under the trade name "Cermet." The method to be described herein may also be applied to resistors of these compounds.

Step A of FIG. 1 shows a nickel-chromium resistor 10 which has been deposited in the form of a thin film on a passive substrate 11. The passive substrate may be glass, glazed ceramic or unglazed ceramic. An active substrate is used for compatible integrated circuits as will be described later in connection with FIG. 2. Thin films of nickel-chromium suitable for resistors may be deposited by vacuum evaporation. Source material to be evaporated is available in the form of pellets containing 75–80% nickel and 20–25% chromium. The composition and dimensions of the film determine its resistance value. Film thickness in the range from 250 Angstroms to 1000 Angstroms are typical.

In Step B of FIG. 1, a pad 12 of metal has been deposited on an area of the resistor where a contact is to be made. Aluminum is probably the most satisfactory contact metal for nickel-chromium resistors because the contact exhibits ohmic behavior and adheres satisfactorily to the resistor. Aluminum is compatible with contact and interconnection requirements for other passive and active components, such that an all aluminum system can be used if desired. The aluminum pad may be deposited by vacuum evaporation through an opening in a mask.

Next, a passivating layer 13 is formed on the top surface of the structure as shown at C. The layer 13 may be a single oxide such as silicon dioxide or aluminum oxide, or a mixed oxide such as $Al_2O_3 \cdot SiO_2$ or $Al_2O_3 \cdot B_2O_3$. Passivating layers of these and other materials may be deposited by vacuum evaporation, sputtering or gas plating techniques. A particularly useful process is described and claimed in a commonly assigned copending application S.N. 310,257 filed on Sept. 20, 1963, by David R. Peterson, and reference is made to that application for information on suitable process conditions.

In Step D of FIG. 1, an opening 14 has been etched through the passivating layer 13 down to the aluminum pad 12. The opening may be made by well known masked etching techniques employing a photoresist material. A suitable photoresist is available under the trademark KPR from the Eastman Kodak Company. U.S. Patent 2,610,120 describes a photoresist material of this general type.

The photoresist material may be applied by brushing, dipping, spraying, spinning or other coating technique to form a film covering the passivating layer 13. The latter film is exposed to ultraviolet light through a negative photographic pattern, and is developed to remove unexposed resist from the area 14 where a hole is to be opened. Suitable developers are methyl ethyl ketone, trichlorethylene and Kodak Photoresist Developer.

The structure is then subjected to an etching solution which may be hydrofluoric acid, an aqueous solution of ammonium bifluoride, or a mixture of ammonium fluoride and hydrofluoric acid. These etchants attack the oxide passivating layer 13, but do not remove the resist. The etching is allowed to continue entirely through the oxide. The etchants named above will attack the aluminum pad 12, but the action is visible and actually serves to indicate when the etching should be terminated. By means of this indication, it is possible to insure that the hole 14 is etched completely through layer 13 so that there will be no residual oxide under the contact metal which is put down subsequently.

After the etching step, the photosensitive resist material is removed by softening it with one of the developers mentioned previously and then washing it off.

A second metallization step is then performed to bring the contact up through hole 14 and over the top of the passivating layer as shown at 15 in Step E of FIG. 1. The metallizing may be done by vacuum evaporation and using another photoresist film to define the metallization pattern. In the latter step, the photoresist masking procedures described above may be used.

The advantages of the double metallization method are evident from the preceding description. Since the aluminum pad 12 is deposited directly on an uncontaminated surface of the resistor 10, good mechanical and electrical contact to the resistor is assured. By etching until the etchant attacks the pad 12, no deposited oxide will exist where the second metallization is put down.

If desired, another metal may be put down on top of the aluminum pad 12 before the passivating layer 13 is formed in order to enhance the indication that the hole is through the oxide. The second metal may be one which reacts visibly with the etchants named above. Examples of suitable metals are titanium, nickel, tin, and zinc. Alternatively, an etch-resistant metal such as silver may be put on top of the aluminum pad to stop or slow down the etching action before it reaches the aluminum pad.

FIG. 2 shows an example of a thin film resistor in a compatible integrated circuit merely to illustrate that the double metallization method may be applied to the fabrication of resistors on an active substrate. The thin film resistor 21 is on top of a silicon oxide layer 22 which covers the junctions 23, 24 and 25 of a transistor within a semiconductor crystal element 26. The resistor is connected to the base region of the transistor by the metal at 27 which is deposited with the metal at 28 which brings the resistor contact 29 out over the passivating layer 30 for the resistor. The method of making contacts to the resistor 21 is exactly as described previously.

Other applications for the invention may be found, and it is believed that modifications may be made within the scope of the claims which follow.

I claim:

1. A method of passivating and making contacts to thin film resistors comprising:
   metallizing a predetermined contact portion of a thin film of resistive conducting material supported by a substrate,
   coating said resistor film including the metallized contact portion thereof with a protective insulating material,
   etching entirely through a portion of said coating to said metallized contact portion of said resistor,
   and again metallizing said resistor contact portion and also a portion of said coating so as to form a contact for said resistor extending to the surface of said coating.

2. A method of passivating and making contacts to thin film resistors comprising:
   depositing on a predetermined portion of a thin film of resistive conducting material supported by a substrate a pad of metal for making electrical contact to the resistor film,
   coating said resistor film and said metal pad with a protective insulating material,
   etching entirely through the portion of said coating over said metal pad to form an opening exposing said pad,
   and depositing metal through said opening on to said pad, and also on a surface of said coating adjoining said opening, so as to form a contact for said resistor extending to the surface of said coating.

3. A method of passivating and making contacts to thin film resistors comprising:
   depositing on a predetermined portion of a thin film of resistive conducting material a pad of metal for making an electrical contact to the resistor film,
   coating said resistor film and said metal pad with a protective insulating material,
   etching entirely through a portion of said coating into, but not through said metal pad to form an opening to said pad,
   and depositing metal through said opening on to the exposed portion of said pad, and also on said coating, so as to extend said contact to the surface of said coating.

4. A method of passivating and making contacts to thin film resistors comprising:
   depositing aluminum on a predetermined contact portion of a thin film resistor of nickel-chromium alloy material,
   depositing a protective oxide coating on said thin film resistor and said aluminum deposit,
   etching with a fluoride etchant entirely through a portion of said oxide coating to said aluminum deposit,
   and again depositing aluminum on said contact portion, and also on a portion of said oxide coating, so as to form a contact for said resistor extending to the surface of said coating.

No references cited.

ALFRED L. LEAVITT, *Primary Examiner.*

A. M. GRIMALDI, *Assistant Examiner.*